US006670817B2

(12) United States Patent
Fournier et al.

(10) Patent No.: US 6,670,817 B2
(45) Date of Patent: Dec. 30, 2003

(54) CAPACITIVE TONER LEVEL DETECTION

(75) Inventors: John C. Fournier, Bowmansville, NY (US); James D. Anthony, Victor, NY (US); Todd C. Beehler, Hamlin, NY (US)

(73) Assignee: Heidelberger Druckmaschinen AG, Heidelberg (DE)

( * ) Notice: Subject to any disclaimer, the term of this patent is extended or adjusted under 35 U.S.C. 154(b) by 0 days.

(21) Appl. No.: 09/876,664

(22) Filed: Jun. 7, 2001

(65) Prior Publication Data

US 2002/0186027 A1 Dec. 12, 2002

(51) Int. Cl.[7] .................................... G01R 27/26
(52) U.S. Cl. .................................... 324/662; 324/658
(58) Field of Search .................................... 324/662, 133, 324/658, 660, 661, 671

(56) References Cited

U.S. PATENT DOCUMENTS 4,204,427 A * 5/1980 Gothe et al. .............. 73/304 C
4,515,015 A * 5/1985 Kuhlman .................... 324/678
4,674,329 A * 6/1987 Mulder ........................ 361/284
4,780,663 A * 10/1988 Mulder ....................... 204/412
4,982,606 A * 1/1991 Adamski et al. .......... 73/304 C
5,465,619 A * 11/1995 Sotack et al. ............... 118/694
6,016,697 A * 1/2000 McCulloch et al. ...... 73/304 C
6,177,874 B1 * 1/2001 Cheng et al. ............... 250/577
6,250,153 B1 * 6/2001 Collins et al. ............ 73/304 C
6,435,025 B1 * 8/2002 Krause ..................... 73/290 R

* cited by examiner

*Primary Examiner*—N. Le
*Assistant Examiner*—John Teresinski

(57) ABSTRACT

A container having an electrically conductive container body. The container body defines a container cavity. A sensor assembly is disposed within said container cavity. The sensor assembly is electrically isolated from the container body, and is configured for sensing a level of material within the container cavity.

19 Claims, 2 Drawing Sheets

CAPACITIVE TONER LEVEL DETECTION

FIELD OF THE INVENTION

The present invention relates generally to an apparatus for the detection of toner levels in an electrophotographic printing machine.

BACKGROUND OF THE INVENTION

Generally, the process of electrophotographic printing and/or copying includes charging a photoconductive surface to a substantially uniform potential or voltage. The charged photoconductive surface is then exposed to record an electrostatic latent image corresponding to an original document to be copied. Thereafter, a developer material is brought into contact with the latent image. The developer material attracts toner particles onto the latent image. The resultant image is then transferred from the charged photoconductive surface onto a copy sheet, to which it is subsequently bonded.

Contaminants, such as paper fragments, developer material, toner and other residue, remain on the photoconductive surface after the image has been transferred to the copy sheet. This residue must be removed from the photoconductive surface prior to the next charging thereof. Typically, a cleaning station is provided within the electrophotographic printing and/or copying machine to remove the residue from the photoconductive surface. The cleaning station generally includes cleaning brushes and a vacuum system. The cleaning brushes dislodge the residue from the photoconductive surface into an air stream created by the vacuum system. The residue is deposited by the air stream into a waste container. The waste container must be emptied when full or nearly full, in order to prevent residual toner particles from being catastrophically distributed throughout the machine. Thus, the level of residual toner within the waste container must be monitored in some way in order to detect when the container is full or nearly full.

One method by which the level of residual toner is conventionally monitored is through the use of an optical monitoring device. Optical devices, however, require frequent cleaning to remove stray contaminants, such as dust and other particles, from the device to ensure proper operation. Further, such optical devices can yield premature or inaccurate indications of a full waste container due to toner dust clinging to the sides of an otherwise empty or only partially full waste container. Such false indications of a full waste container can result in increased machine downtime due to the required operator intervention to clear such a false indication.

Another method by which the level of residual toner is conventionally monitored is through the use of a weighing device which measures the weight of the waste container to thereby indicate when the container is full or nearly full. Such weighing devices require frequent calibration. Furthermore, different types of toner will have different densities. When, for example, a lower density toner is in use, a weight-based monitoring system can result in the waste container being filled with residual toner before the system indicates a full waste container. Such a failure to detect a full waste container results in toner particles being catastrophically distributed throughout the machine, increased machine downtime, and is likely to require a lengthy servicing of the machine.

Yet another method by which the level of residual toner is conventionally monitored is through the use of a capacitive sensor disposed on the outside of and adjacent to the waste container. Such external capacitive sensors are susceptible to electrostatic discharge and other forms of electrical interference which can contribute to an erroneous indication of container status. Further, and similar to optical systems, particles, such as stray toner and other particles, may become lodged between the waste toner bottle and one or more of the electrodes or plates thereby interfering with the operation of the sensor. Moreover, such external capacitive sensors may be bumped and damaged during changing and/or emptying of the waste toner bottle.

Therefore, what is needed in the art is a toner level sensing device that is less affected by stray toner particles and other contaminants.

Furthermore, what is needed in the art is a toner level sensing device that is less sensitive to variations in toner density.

Still further, what is needed in the art is a toner level sensing device that is less susceptible to electrical noise and has a high signal-to-noise ratio.

Moreover, what is needed in the art is a toner level sensing device that is less susceptible to erroneous operation due to electrostatic discharge and other forms of electrical interference, and can be used with a conductive bottle.

SUMMARY OF THE INVENTION

The present invention provides an apparatus for detecting the level of material within a container.

The invention comprises, in one form thereof, a container having an electrically conductive container body. The container body defines a container cavity. A sensor assembly is disposed within said container cavity. The sensor assembly is electrically isolated from the container body, and is configured for sensing a level of material within the container cavity.

An advantage of the present invention is that the sensor is disposed within the container, and thus is less effected by electrical noise, large objects and other contaminant particles.

Another advantage of the present invention is that it less sensitive to variations in toner density.

Yet another advantage of the present invention is that toner particles are less likely to cling or stick to the sensor or to the sides of the waste container, or become lodged between the sensor plates, and therefore it is less susceptible to erroneous operation.

A still further advantage of the present invention is that it is less susceptible to erroneous operation due to electrostatic discharge and other forms of electrical interference.

An even further advantage of the present invention is that it has a high signal-to-noise ratio.

Other advantages of the present invention will be obvious to one skilled in the art and/or appear hereinafter.

BRIEF DESCRIPTION OF THE DRAWINGS

The above-mentioned and other features and advantages of this invention, and the manner of attaining them, will become appreciated and be more readily understood by reference to the following detailed description of one embodiment of the invention in conjunction with the accompanying drawings, wherein.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE DRAWINGS

Figure 1:
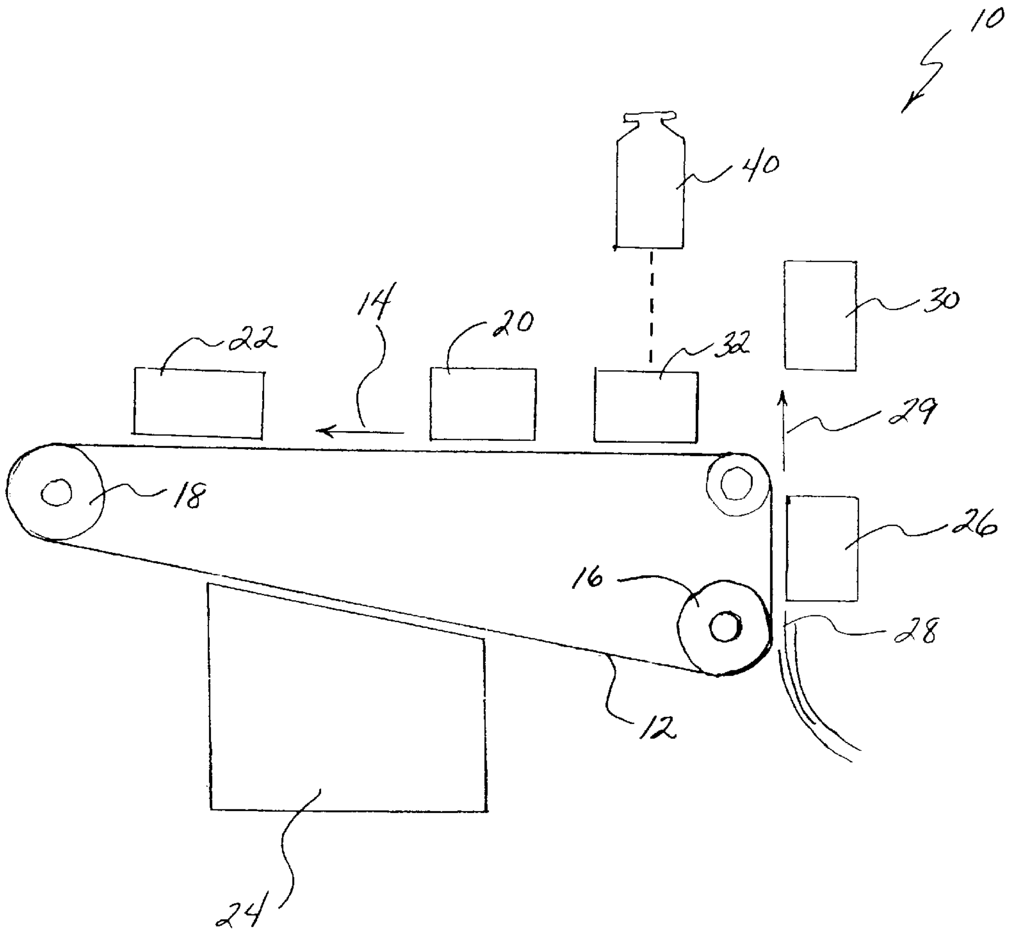
FIG. 1 is a schematic elevational view of portions of an electrophotographic printing machine incorporating one embodiment of a capacitive toner level detector of the present invention.

Referring now to the drawings, and particularly to FIG. 1, there is shown an electrophotographic printing and/or copying machine incorporating one embodiment of a capacitive toner level detector of the present invention.

Electrophotographic printer or copying machine 10 generally includes main belt 12 that rotates through the various functional areas or stations of machine 10. Belt 12 is typically constructed of an electrically conductive material, and has a photoconductive surface deposited thereon or otherwise affixed thereto. Belt 12 is driven in the direction of arrow 14 by drive roller 16, which is driven by a motor (not shown), and is tensioned by tensioning roller 18. A portion of belt 12 is first passed through charging station 20, such as a corona generating device, which charges belt 12 to a predetermined electrical potential that is typically negative. Belt 12 is then rotated to exposure station 22, which selectively discharges the photoconductive surface of belt 12 to thereby form an electrostatic latent image that corresponds to an original to be printed or copied.

The latent image now on the surface of belt 12 is rotated to development station 24, wherein toner particles are brought into contact with the latent image by, for example, magnetic brush rollers to thereby form a toner image on belt 12. Belt 12 is then rotated to place the toner image within transfer station 26, and an image substrate 28, such as a piece of paper or transparency, is brought into contact with the toner image. Transfer station 26 ionizes or otherwise charges, typically through a corona generating device, image substrate 28 and thereby attracts the toner image to image substrate 28. Image substrate 28 is then passed in the direction of arrow 29 to fusing station 30 wherein the toner image is fused, typically by fusing rollers, to image substrate 28. Image substrate 28 is then separated from belt 12 and is guided to a paper tray for removal from machine 10 by an operator.

Belt 12 is then cleaned of residual toner particles at cleaning station 32. Cleaning station 32 typically includes a charging station that charges to a suitable electrical potential and polarity the residual toner particles remaining on the photoconductive surface of belt 12. Cleaning station 32 further typically includes at least one vacuum-assisted electrostatic cleaning brush. The cleaning brush rotates at relatively high speed to create sufficient mechanical force to remove the residual toner from belt 12. The dislodged residual toner particles are drawn into an air stream created by a vacuum device, also typically included within cleaning station 32, which deposits the residual toner particles into conductive container 40.

Figure 2:
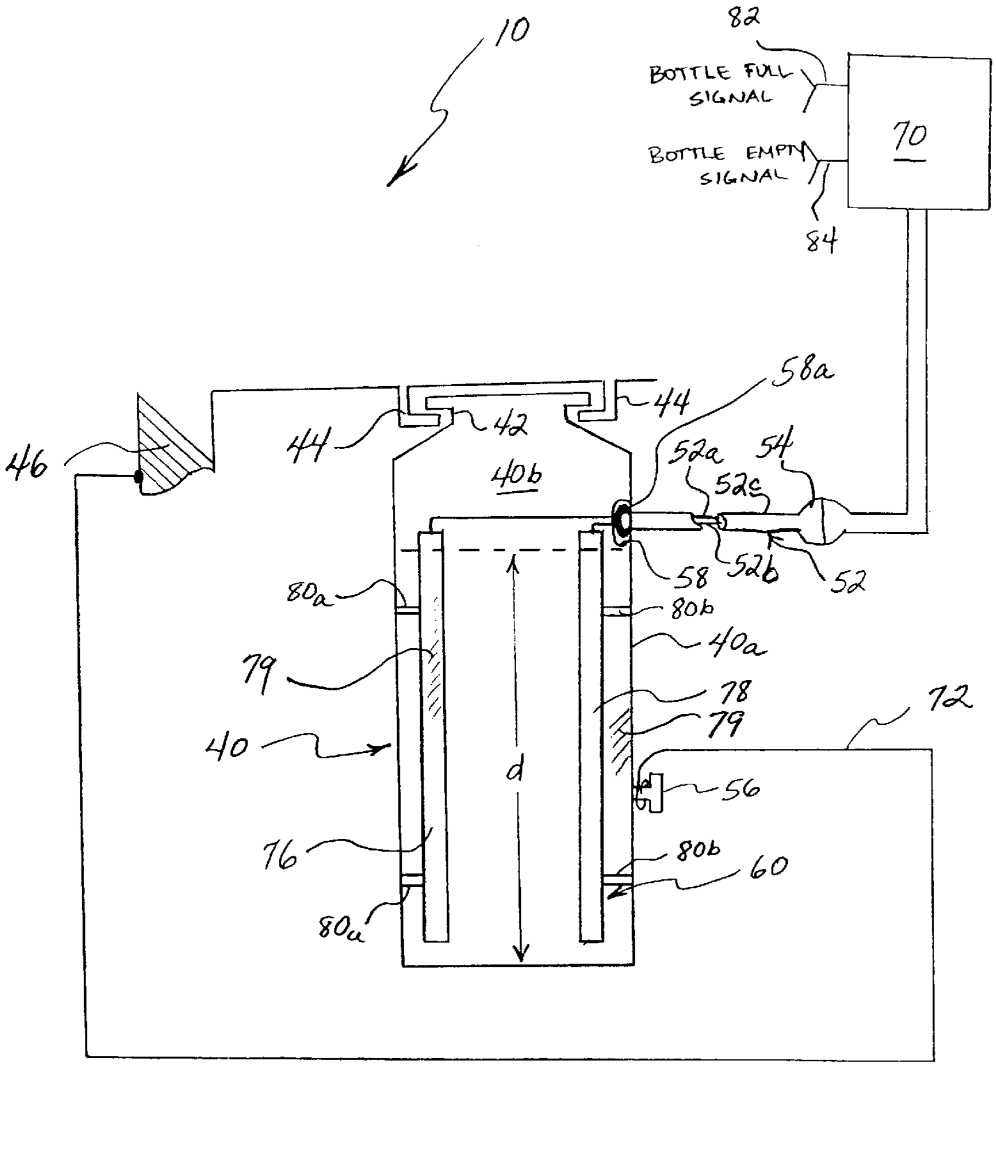
FIG. 2 is an elevational view of the container and capacitive toner level detector of FIG. 1.

Conductive container 40, referring now to FIG. 2, includes container body **40*a* which defines container cavity 40*b*. Conductive container 40 is installed within machine 10 such that the residual toner particles carried by the air stream are deposited in container cavity 40*b*. More particularly, conductive container 40 is suspended by neck 42 from brackets 44 of machine 10. Brackets 44 are attached to or integral with frame 46 of machine 10. Conductive container 40 is constructed of an electrically conductive material, such as, for example, aluminum or other suitable material. Conductive container 40 further includes electrical cable 52, connector 54, grounding wire attachment 56, orifice 58 and sensor assembly 60**.

Electrical cable 52 electrically interconnects sensing circuit 70 with sensor assembly 60. Electrical cable 52, includes electrical conductors or wires **52*a*, 52*b* and an insulative cover 52*c*. Electrical cable 52 is terminated at one end thereof by connector 54. Connector 54 is, for example, a standard electrical connector which mates with a corresponding connector (not referenced) associated with circuit 70 to thereby electrically interconnect sensing circuit 70 and sensor assembly 60. Electrical cable 52 passes through orifice 58 defined by conductive container 40 and into the interior of conductive container 40. Sealing member 58*a*, such as, for example, a gasket or seal, is disposed in association with orifice 58 to thereby seal the interface of insulative cover 52*c* and conductive container 40 in a fluid and liquid tight manner to thereby prevent the escape of residual toner particles from conductive container 40**.

Ground wire attachment 56, such as, for example, a quick connect device or terminal, is affixed to or integral with conductive container 40. A first end of ground wire 72 is received within or affixed to ground wire attachment 56 to thereby electrically interconnect ground wire 72 and conductive container 40. A second end of ground wire 72 is electrically connected, such as, for example, soldered or through an electrical connecter, to frame 46 of machine 10. Frame 46 of machine 10 is held at ground potential. Thus, ground wire 72 electrically interconnects conductive container 40 to frame 46 and thereby holds conductive container 40 at ground potential.

Sensor assembly 60 senses the level of waste or residual toner particles disposed within conductive container 40. Sensor assembly 60 includes a first electrode or plate 76 and a second electrode or plate 78. Each of plates 76 and 78 is coated with a non-stick coating 79, such as, for example, polytetrofluroethylene or other suitable non-stick coatings. Each of plates 76, 78 are disposed within and mechanically secured to conductive container 40, and are electrically isolated from conductive container 40. More particularly, plates 76, 78 are mechanically secured to and electrically isolated from conductive container 40 by electrically non-conductive fasteners **80*a*, 80*b*, respectively, such as, for example, plastic brackets or snap-fit tabs or projections, which are in turn affixed to an inside surface of conductive container 40. Plates 76, 78 are disposed within conductive container 40 at approximately the same distance d from the bottom thereof, are spaced a predetermined distance apart from each other, and are disposed at generally diametrically-opposed points of conductive container 40. Each of plates 76, 78 is electrically connected to a respective one of wires 52*a*, 52*b* of electrical cable 52, to thereby connect plates 76, 78 to circuit 70**.

More particularly, wire **52*a* interconnects plate 76 to a node (not shown) of circuit 70 that is held at ground or nearly ground potential, such as, for example, by a virtual ground amplifier (not shown) having a low input impedance. Wire 52*b* interconnects plate 78 to a voltage signal source, such as, for example, an oscillating circuit or alternating current sine wave generator (neither of which is shown), included within circuit 70, or to a suitable voltage signal source within machine 10. Thus, plate 78 carries a voltage signal source whereas plate 76 is held at ground or nearly ground potential. The voltage signal source applied to plate 78 induces a corresponding current on plate 76. The magnitude of the current induced in plate 76 will vary dependent upon the amount of waste or residual toner that is disposed between plates 76 and 78. If a substantial amount of residual toner is disposed within conductive container 40 between plates 76 and 78, the magnitude of the current induced in plate 76 will be relatively high compared to the current induced in plate 76 when no or only a small amount of residual toner is disposed within conductive container 40 between plates 76 and 78**.

The current induced in plate 76 is carried by wire 52*a* to circuit 70. Circuit 70 converts the induced current, such as, for example, by a rectifier, to an indicating direct current (DC) voltage which is then compared, such as, for example, by a comparator, to a reference DC voltage. The reference DC voltage corresponds to a predetermined DC voltage level that is indicative of conductive container 40 being full or nearly full of residual toner particles. If the indicating voltage is greater than the reference voltage, conductive container 40 is full and bottle fall signal 82 is issued by circuit 70. In response to bottle full signal 82 associated control circuitry (not shown) of machine 10 suspends the operation thereof until conductive container 40 is emptied to thereby reset full signal 82. If the indicating voltage is less than the reference voltage, conductive container 40 is not full and bottle empty signal 84 is issued by circuit 70.

In use, and as stated above, residual and waste toner particles are dislodged from belt 12 and deposited into conductive container 40 by cleaning station 32. This process continues until the level of waste toner particles contained within conductive container 40 reaches approximately depth d, whereupon the induced current in plate 76 increases to a level which results in bottle full signal 82 being issued and the operation of machine 10 being suspended as described above.

In conventional nonconductive toner waste containers toner particles tend to cling to and accumulate first upon the sides of the container due to electrostatic forces. Such a condition can result in a premature indication that the nonconductive container is full due to the sides of the container being completely covered with toner particles. Due to the tendency of the toner particles to cling to accumulate first upon the sides of the container, a large area or volume in the middle portion of the container is often virtually empty and the full capacity of the nonconductive container is not utilized. In contrast, conductive container 40 is held at ground potential by ground wire 72. As particles of waste toner drop into conductive container 40 and accumulate therein, any electrostatic charge on conductive container 40 and/or the toner particles is dissipated by virtue of conductive container 40 being held at ground potential. The toner particles are therefore less likely to cling to and accumulate on the sides of conductive container 40 due to electrostatic force. The toner particles are more likely to settle into and utilize the entire volume of conductive container 40, and the likelihood of a premature indication of a full condition of conductive container 40 is thereby reduced.

Any electrostatic charges that would build up on an otherwise nonconductive waste container are dissipated by virtue of conductive container 40 being constructed of an electrically conductive material and being held at ground potential via ground wire 72. Since any electrostatic charge on conductive container 40 is dissipated, sensor assembly 60 is less susceptible to electrostatic charge on conductive container 40. Furthermore, the grounding of conductive container 40 reduces the susceptibility of sensor assembly 60 to various other forms of electrical interference, such as random electrostatic discharges which occur in the electrically noisy environment of machine 10. Moreover, the positioning of sensor assembly 60 within conductive container 40 reduces the exposure of sensor assembly 60 to electrostatic discharges and other forms of electrical interference. Thus, an erroneous indication of a full, or a faulty indication of an empty, conductive container 40 is less likely to occur.

Sensor plates 76, 78 are each covered with non-stick coating 79. Non-stick coating 79 inhibits toner particles that enter and accumulate within conductive container 40 from adhering to sensor plates 76, 78. Toner particles which adhere to plates 76, 78 affect, i.e., increase, the magnitude of the current induced in plate 76 and can therefore lead to an erroneous full bottle indication. Thus, non-stick coating 79 of plates 76, 78, by making toner particles less likely to adhere thereto, reduces the likelihood that sensor assembly 60 will yield false bottle fall indications.

In the embodiment shown, sensor assembly 60 includes two plates or electrodes 76, 78. However, it is to be understood that the sensor assembly of the present invention can be alternately configured, such as, for example, with four or more plates or electrodes Furthermore, plates 76, 78 are shown as being generally diametrically-opposed within container 40. However, it is to be understood that the electrode plates can be alternately configured, such as, for example, variously spaced apart and/or positioned within the conductive container.

In the embodiment shown, container 40 includes ground wire attachment 56 disposed on the exterior of the container. However, it is to be understood that the container of the present invention can be alternately configured, such as, for example, with a ground wire attachment disposed on the inside of the container.

In the embodiment shown, a separate ground wire 72 electrically connects ground wire attachment 56 of container 40 to frame 46 of machine 10. However, it is to be understood that a ground wire can be incorporated into electrical cable 52, and be similarly connected between frame 46 and ground wire attachment 56.

While this invention has been described as having a preferred design, the present invention can be further modified within the spirit and scope of this disclosure. This application is therefore intended to cover any variations, uses, or adaptations of the present invention using the general principles disclosed herein. Further, this application is intended to cover such departures from the present disclosure as come within the known or customary practice in the art to which this invention pertains and which fall within the limits of the appended claims.

What is claimed:

1. A container, comprising:

a container having an electrically conductive body enclosing a cavity for receiving and holding solid particles of a material; and a sensor assembly disposed within said container, said sensor assembly being electrically isolated from said body, said sensor assembly configured for sensing a level of solid particles of the material within said container cavity, said sensor assembly comprising a capacitive sensor and having a first electrode plate and a second electrode plate spaced apart from said first electrode plate to present opposing surfaces to each other, said fist electrode plate configured for being electrically connected to a virtual ground and said second electrode plate configured for being connected to a voltage signal source, said opposing surfaces of the two plates coated with a non-stick coating to inhibit particles of material between the plates from adhering to surfaces of the plates wherein the plates form a capacitor having a capacitance dependent upon the level of the solid particles of material between the two plates.

2. The container of claim 1 wherein said plates are oriented substantially parallel to each other.

3. The container of claim 1 wherein the body is made of conductive material and the plates are electrically isolated from said body.

4. The container of claim 1 wherein said non-stick coating comprises polytetrafluoroethylene.

5. The container of claim 1 wherein each plate is disposed a predetermined depth from a bottom of said container.

6. The container of claim 1, further comprising:

an electrical cable having a plurality of conductors, each of said plurality of conductors electrically connected at a first end thereof to a respective one of said first electrode and said second electrode, an electrical connector electrically connected to a second end of each of said plurality of conductors.

7. The container of claim 6, wherein said container body defines an orifice, said electrical cable extending through said orifice.

8. The container of claim 7, further comprising a sealing member for sealingly engaging each of said orifice and said electrical cable.

9. The container of claim 1, further comprising a ground wire attachment means, said ground wire attachment means configured for receiving and retaining a ground wire to thereby electrically connect said container body to a ground potential.

10. The container of claim 1, wherein said ground wire attachment means is one of affixed to and integral with said conductive container body.

11. The container of claim 1, wherein said sensor assembly is mechanically secured to said container body by electrically nonconductive fastening means.

12. An electrophotographic printing machine, comprising:

at least one waste container having an electrically conductive container body, said container body defining a container cavity; and a sensor assembly disposed within said container, said sensor assembly being electrically isolated from said body, said sensor assembly configured for sensing a level of solid particles of the material within said container cavity, said sensor assembly comprising a capacitive sensor and having a first electrode plate and a second electrode plate spaced apart from said first electrode plate to present opposing surfaces to each other, said fist electrode plate configured for being electrically connected to a virtual ground and said second electrode plate configured for being connected to a voltage signal source, said opposing surfaces of the two plates coated with a non-stick coating to inhibit particles of material between the plates from adhering to surfaces of the plates wherein the plates form a capacitor having a capacitance dependent upon the level of the solid particles of material between the two plates.

13. The electrophotographic printing machine of claim 12, wherein said non-stick coating comprises polytetrafluoroethylene.

14. The electrophotographic printing machine of claim 12, further comprising: an electrical cable having a plurality of conductors, each of said plurality of conductors electrically connected at a first end thereof to a respective one of said first electrode and said second electrode, an electrical connector electrically connected to a second end of each of said plurality of conductors.

15. The electrophotographic printing machine of claim 12, further comprising a ground wire attachment means, a ground wire attached at a first end thereof to said ground wire attachment means and at a second end thereof to a chassis of said electrophotographic printing machine to thereby electrically connect said container body to ground potential.

16. An electrophotographic printing engine having stations for charging a photoconductor, selectively discharging portions of the charged photoconductor to form a latent electrostatic image, developing the latent image with solid electrophotographic toner particles, transferring the developed image to a copy sheet and fixing the developed image on the copy sheet, wherein the printing engine further comprises a toner level sensor, comprising:

at least one waste container having an electrically conductive container body, said container body defining a container cavity for holding solid electrophotographic toner particles; and a sensor assembly disposed within said container, said sensor assembly being electrically isolated from said body, said sensor assembly configured for sensing a level of said solid electrophotographic toner particles within said container cavity, said sensor assembly comprising a capacitive sensor and having a first electrode plate and a second electrode plate spaced apart from said first electrode plate to present opposing surfaces to each other, said fist electrode plate configured for being electrically connected to a virtual ground and said second electrode plate configured for being connected to a voltage signal source, said opposing surfaces of the two plates coated with a non-stick coating to inhibit solid toner material particles between the plates from adhering to surfaces of the plates wherein the plates form a capacitor having a capacitance dependent upon the level of the solid toner particles between the two plates.

17. The electrophotographic printing engine of claim 16, wherein said non-stick coating comprises polytetrafluoroethylene.

18. The electrophotographic printing engine of claim 16, further comprising: an electrical cable having a plurality of conductors, each of said plurality of conductors electrically connected at a first end thereof to a respective one of said first electrode and said second electrode, an electrical connector electrically connected to a second end of each of said plurality of conductors.

19. The electrophotographic printing engine of claim 16, further comprising a ground wire attachment means, a ground wire attached at a first end thereof to said ground wire attachment means and at a second end thereof to a chassis of said electrophotographic printing machine to thereby electrically connect said container body to ground potential.

* * * * *